US006573192B1

(12) United States Patent
Lee

(10) Patent No.: US 6,573,192 B1
(45) Date of Patent: Jun. 3, 2003

(54) DUAL THICKNESS GATE OXIDE FABRICATION METHOD USING PLASMA SURFACE TREATMENT

(75) Inventor: Heon Lee, Sunnyvale, CA (US)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 09/667,053

(22) Filed: Sep. 21, 2000

(51) Int. Cl.[7] .................... H01L 21/31; H01L 21/469
(52) U.S. Cl. .................... 438/770; 438/766; 438/585
(58) Field of Search .................... 438/585, 706, 438/735, 281, 269, 923, 765, 775, 770, 197, 766, 776, 777, 769, 591, 423, 758, 761, 762, 239, 211, 588; 365/185.01; 326/41

(56) References Cited

U.S. PATENT DOCUMENTS

| 4,957,877 | A | * | 9/1990 | Tam et al. ............... 437/43 |
| 5,254,489 | A | * | 10/1993 | Nakata ............... 437/40 |
| 5,480,828 | A | * | 1/1996 | Hsu et al. ............... 437/56 |
| 5,502,009 | A | * | 3/1996 | Lin ............... 437/239 |
| 6,033,943 | A | * | 3/2000 | Gardner ............... 438/199 |
| 6,080,682 | A | * | 6/2000 | Ibok ............... 438/770 |
| 6,143,669 | A | * | 11/2000 | Cho ............... 438/770 |
| 6,165,846 | A | * | 12/2000 | Carns et al. ............... 438/264 |
| 6,300,197 | B1 | * | 10/2001 | Inaba ............... 438/258 |

OTHER PUBLICATIONS

Wolf and Tauber; Silicon Processing for the VLSI Era vol. 1: Process Technology; pp 541 and 555; Lattice Press, 1986; Sunset Beach, California.*

* cited by examiner

Primary Examiner—Olik Chaudhuri
Assistant Examiner—Fernando Toledo
(74) Attorney, Agent, or Firm—Stanton Braden

(57) ABSTRACT

A method of forming on a common semiconductor body (substrate) silicon oxide layers of different thicknesses uses plasma treatment on selected portions of an original thermally grown silicon oxide layer. The plasma treated portions are completely etched away to expose a portion of the surface of the body while non-selected portions of the original silicon oxide layer are little effected by the etch. A thermally grown second layer of silicon oxide is formed with the result being that the silicon oxide layer formed in the exposed portions of the body is thinner than elsewhere. The use of dual thickness silicon oxide layers is useful with dynamic random access memories (DRAMs) as gate oxide layers of field transistors of memory cells of the DRAM typically require different electrical characteristics than transistors of support circuitry of the DRAM.

3 Claims, 2 Drawing Sheets

DUAL THICKNESS GATE OXIDE FABRICATION METHOD USING PLASMA SURFACE TREATMENT

FIELD OF THE INVENTION

This invention relates to integrated circuits, and more particularly, to Complementary Metal Oxide Semiconductor (CMOS) and Metal Oxide Semiconductor Field Effect Transistors (MOSFETs) having different gate oxide thicknesses on a semiconductor body (substrate, wafer), and to methods of forming these different thicknesses.

BACKGROUND OF THE INVENTION

The fabrication of silicon semiconductor wafers has become more complex as designers and process engineers move toward smaller and faster circuit devices. Advanced designs typically use 0.18 μm design rules and semiconductor chips contain more circuit components, such as capacitors and resistors, in addition to transistors. The Integrated Gate Field Effect Transistors (IGFETS) not only require thinner, defect-free gate oxides, but also gate oxides having different thicknesses. Many processes have been developed to obtain these thin gate oxides but, often, the transistors with relatively thin oxides are fabricated in a manner that introduces defects. Many of these defects cannot be removed by annealing and thereby contribute to reliability problems, such as gate leakage or gate oxide breakdown.

The goal that is being sought is to have gate oxides grown by thermal oxidation on major surfaces of the semiconductor body with different thicknesses to provide circuit designers with variable transistor characteristics or performance of one set of transistors with respect to another set of transistors.

One method of fabricating gate oxides that is in use today relies on a photoresist mask to define that part of a major surface of the semiconductor body on which a gate oxide is to be grown. This resist mask method can result in degraded gate oxides when the photoresist is stripped from the 'protected' gate oxide surface. The unprotected gate oxide is totally removed during the etching so that it is not a concern. It has been shown that when the photoresist is stripped and the gate oxide surface is 'cleaned', residues still remain. These residues get incorporated into the gate oxide during the gate oxide regrowth needed to form multiple gate oxide thicknesses.

Other methods of forming gate oxides found in prior art use ion implantation to effect the silicon surfaces so that subsequent oxide etching of the implanted portion of the gate oxide will be etched more rapidly than on the untreated portion of the gate oxide. However, it is critically important that the implantation energy is controlled so that implantation damage is not a factor during gate oxide regrowth. Some have tried to use low energy implantations to reduce the deleterious effects caused by the high energy implants, but the fine tuning of the implantation energy creates a narrow processing window. This narrow window can limit the effect of the implantation on the etch rate of the implanted portion of the gate oxide and thereby, not completely prevent oxide defects.

It is desirable to be able to create different oxide thicknesses of transistors on a common semiconductor chip while reducing the problems associated with methods used in the prior art.

SUMMARY OF THE INVENTION

In a first illustrative embodiment the invention is a method for forming two oxide layers having different thicknesses on a surface of a semiconductor body comprising the steps of: forming a first oxide layer on the surface of the semiconductor body; subjecting a first portion of the first oxide layer to a plasma while protecting a second portion of the first oxide layer from the plasma; subjecting the first oxide layer to an etchant which removes all of the first portion of the first oxide layer which was exposed to the plasma while leaving at least a part of the second portion of the first oxide layer which was protected from the plasma; and oxidizing the semiconductor body to form a second oxide layer on the exposed portion of the semiconductor surface and to increase the thickness of the remaining second portion of the first oxide layer such that the second oxide layer is thinner than the thickened first oxide layer.

In a second illustrative embodiment the invention is a method for forming two oxide layers having different thicknesses on a surface of a semiconductor body comprising the steps of: oxidizing the surface of the semiconductor body to form a first oxide layer thereon; subjecting a first portion of the first oxide layer to a plasma while protecting a second portion of the first oxide layer from the plasma; subjecting the first oxide layer to an etchant which removes all of the first portion of the first oxide layer which was exposed to the plasma while leaving at least a part of the second portion of the first oxide layer which was protected from the plasma; and oxidizing the semiconductor body to form a second oxide layer on the exposed portion of the semiconductor surface and to increase the thickness of the remaining second portion of the first oxide layer such that the second oxide layer is thinner than the thickened first oxide layer.

In a third illustrative embodiment the invention is a method for forming two oxide layers having different thicknesses on a surface of a semiconductor body comprising the steps of: oxidizing the surface of the semiconductor body to form a first oxide layer thereon; providing a protective layer over a portion of the first oxide layer so as to protect same from the effects of plasma; subjecting the partially first oxide layer to a plasma; removing the protective layer; subjecting the first oxide layer to an etchant which removes all portion thereof which was not covered by the protective layer to expose a portion of the surface of the semiconductor body while leaving at least a portion of the first oxide layer which was protected from the plasma by the protective layer; and oxidizing the semiconductor body to form a second oxide layer on the exposed portion of the semiconductor surface and to increase the thickness of the portion of the first oxide layer which was protected by the protective layer such that the second oxide layer is thinner than the thickened first oxide layer.

In a fourth illustrative embodiment the invention is a method for forming two oxide layers having different thicknesses on a surface of a semiconductor body comprising the steps of: thermally oxidizing the surface of the semiconductor body to form a first oxide layer thereon; providing a protective layer over a portion of the first oxide layer so as to protect same from the effects of plasma; subjecting the partially first oxide layer to a plasma; removing the protective layer; subjecting the first oxide layer to an etchant which removes all portion thereof which was not covered by the protective layer to expose a portion of the surface of the semiconductor body while leaving at least a portion of the first oxide layer which was protected from the plasma by the protective layer; and thermally oxidizing the semiconductor body to form a second oxide layer on the exposed portion of the semiconductor surface and to increase the thickness of the portion of the first oxide layer which was protected by the protective layer such that the second oxide layer is thinner than the thickened first oxide layer.

In a fifth illustrative embodiment the invention is two field effect transistors on a common semiconductor body having different thicknesses of gate oxides which are formed using a method comprising the steps of: forming a first oxide layer on a surface of the semiconductor body; subjecting a first portion of the first oxide layer to a plasma while protecting a second portion of the first oxide layer from the plasma; subjecting the first oxide layer to an etchant which removes all of the first portion of the first oxide layer which was exposed to the plasma while leaving at least a part of the second portion of the first oxide layer which was protected from the plasma; and oxidizing the semiconductor body to form a second oxide layer on the exposed portion of the semiconductor surface and to increase the thickness of the remaining second portion of the first oxide layer such that the second oxide layer is thinner than the thickened first oxide layer.

In a sixth illustrative embodiment the invention is first and second semiconductor devices which each comprise a oxide layer formed on a surface of a common semiconductor body with the thicknesses of the oxide layers being different from one another and one of same having been protected from a plasma during fabrication.

The invention will be better understood from the following more detailed description taken in conjunction with the accompanying drawings and claims.

The drawings are not necessarily drawn to scale.

DETAILED DESCRIPTION

Figure 1:
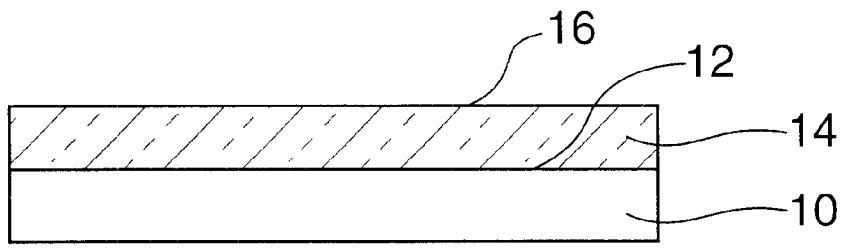
FIGS. 1–6 show cross sectional views of a semiconductor body (substrate) being processed to obtain the different oxide thicknesses in accordance with an embodiment of the present invention.

FIG. 1 shows a portion of a cross-sectional view of a semiconductor body (substrate) 10 having a top surface 12 covered with a thermally grown thin oxide layer 14 having a top surface 16.

Figure 2:
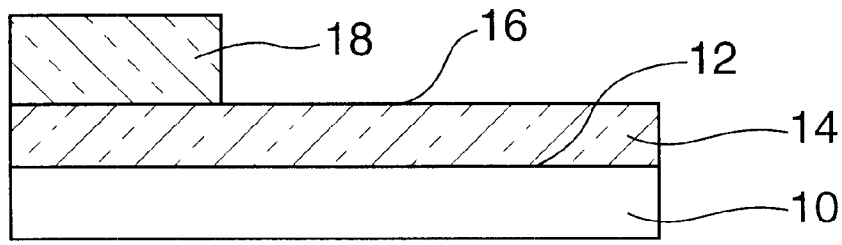

FIG. 2 shows a portion of the cross-sectional view of the semiconductor body 10 with the thin, thermally grown oxide layer 12 partially covered with a patterned layer 18 of photoresist.

Figure 3:
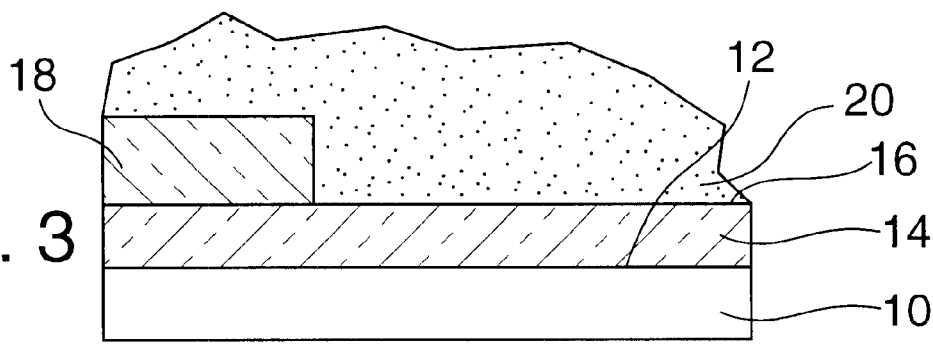

FIG. 3 shows a cross-sectional view in which that part of the thermal oxide layer 14 not covered with photoresist layer 18 is exposed to a hydrogen bromide (HBr)-oxygen ($O_2$) plasma 20 for 5 to 10 seconds. Any plasma which has a high selectivity to oxide can be used for this purpose. In an illustrative embodiment the plasma characteristics are: Pressure=50 mT, HBr=50 sccm, $O_2$=10 sccm, and He=100 sccm, and Plasma Source Power=300 W and Bias Power=80 W (using a commercially available Lam Research plasma etcher).

Figure 4:
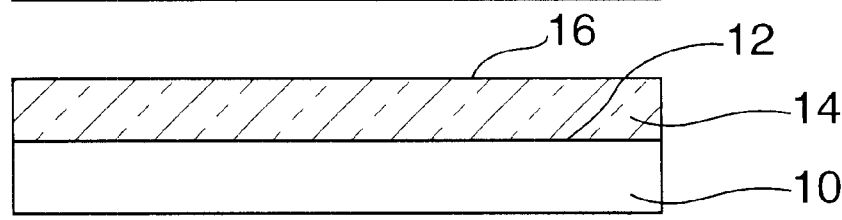

FIG. 4 shows a cross-sectional view of the semiconductor body 10 and the thin, thermally grown oxide layer 14 after the patterned photoresist layer 18 has been removed and the surface 16 has been cleaned using conventional silicon cleaning solutions.

Figure 5:
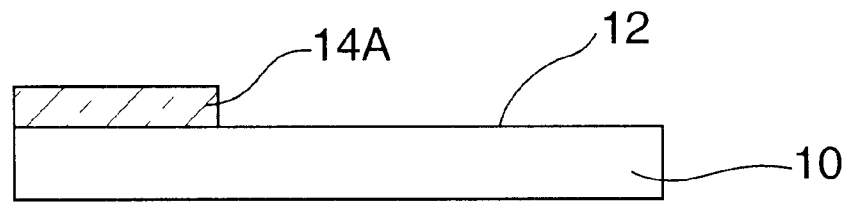

FIG. 5 shows that the portion of the thin oxide layer 14, which had been subjected to the plasma, is completely removed from surface 12 by a wet etching solution. The remaining portion of layer 14, shown as layer 14A, is partially etched by the etchant so that approximately 20 Å is removed.

Figure 6:
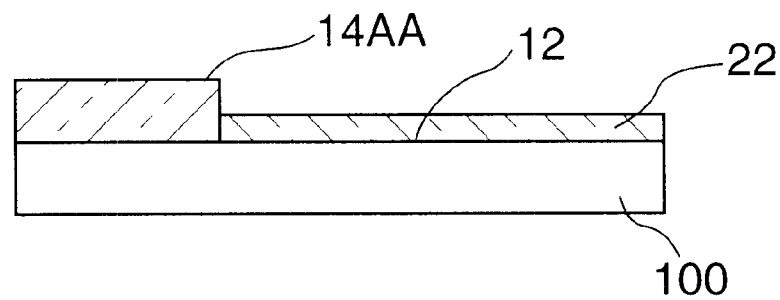

FIG. 6 shows the portion of the semiconductor body 10 after a thermal oxide layer 22 is regrown on surface 12 and, simultaneously, the oxide thickness of layer 14A is increased to result in layer 14AA.

Figure 7:
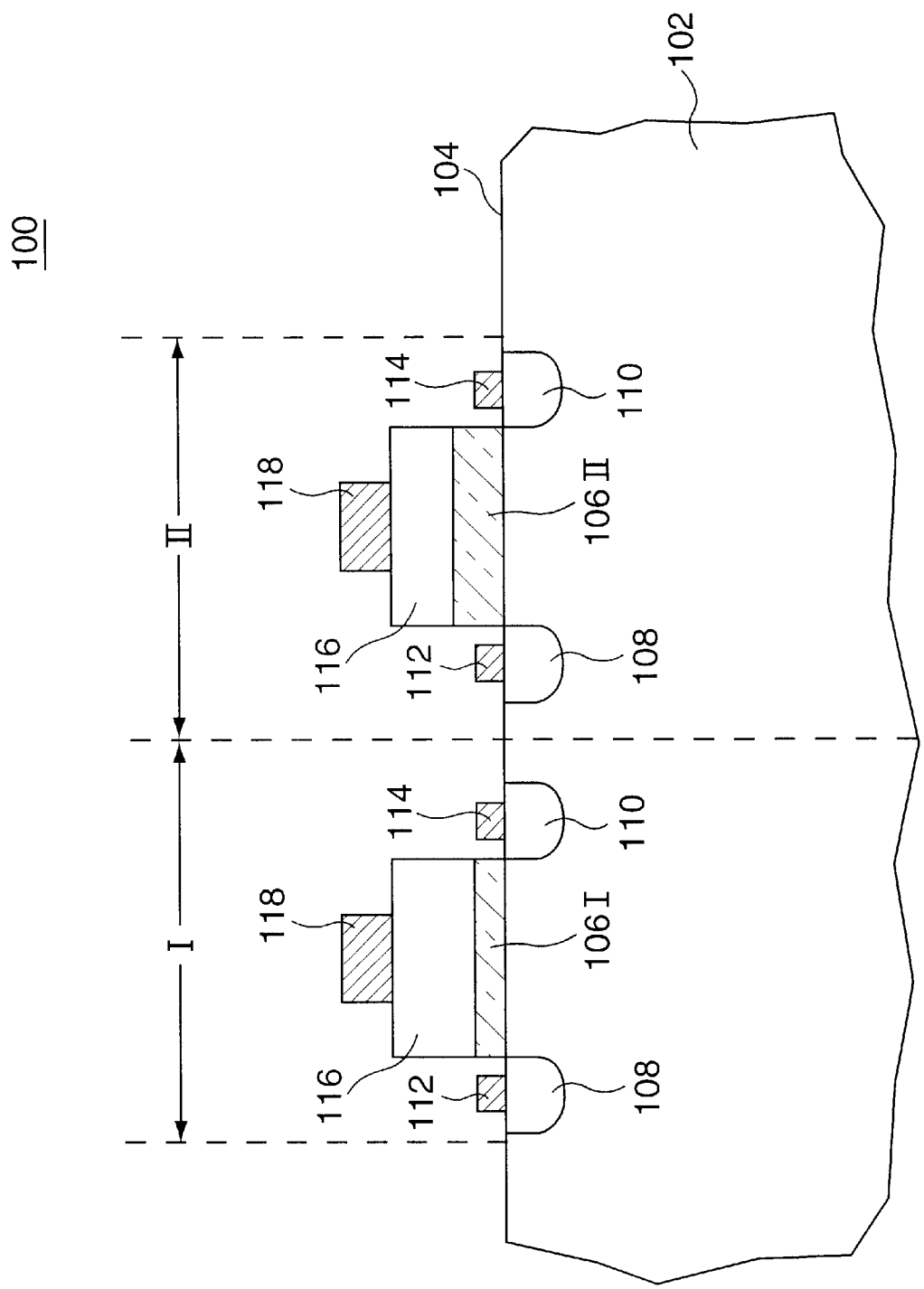
FIG. 7 shows a cross sectional view of a part of a semiconductor body containing field effect transistors having different gate oxide thicknesses.

FIG. 7 shows a semiconductor 100 comprising a semiconductor body 102 having a top surface 104 with a first Metal Oxide Field Effect Transistor (MOSFET) formed in a first region (I) thereof and a second MOSFET formed in a second region (II) thereof.

The transistors of regions I and 11 are essentially the same except a gate oxide layer 106I of the transistor of region I is thinner than a gate oxide layer 106II of the region II. Each transistor has a drain region 108 separated from a source region 110 by portions of body 102. The body 102 is of one conductivity type, for example p-type conductivity, and the drain regions 108 and the source regions 110 are all of the same, opposite conductivity type, for example, n-type conductivity. The areas at which these source and drain regions 108 and 110, respectively, are formed are defined by various known masking techniques. The gate oxide layers 106I and 106II are formed over the surface 104 and are located between the respective source and drain regions 108 and 110 corresponding to regions I and II, respectively. Drain contacts 112 contact each drain region 108 and source contacts contact each source region 110.

Separate gate conducting layers 116 are formed over gate oxide layers 106I and 106II. The gate conducting layers 116 are typically polysilicon doped with phosphorus. A separate gate contact 118 contacts each one of layers 116. The gate oxide 106I is formed on that portion of the semiconductor body 102 which had been subjected to the plasma whereas the thicker gate oxide 106II is formed on that portion of the semiconductor body 102 which had been protected from the plasma.

Although FIG. 7 depicts only one set of regions I and II together with only one set of two MOSFETS, it should be understood that the body 102 typically supports many more similar regions each containing a similar set of two MOSFETS. Hence, typically many more, similar sets of two MOSFETS are integrated in the body 102 to form an array of such structures.

Each of these MOSFETS can be formed using either a self-aligned process or a non-self-aligned process with respect to the gate. Structures using either of these processes can benefit from the improved method of forming the gate oxides in accordance with the present invention.

As noted above, the present invention is directed to a method for controlling the gate oxide thickness in the regions I and II while improving device reliability. In an illustrative example, the gate oxide layer 106I is approximately 30 Å thick and the gate oxide layer 106II is approximately 60 Å thick.

Typically, to achieve these gate oxide thicknesses, a plasma composed of HBr, $O_2$, and He is used for that portion of the semiconductor body 102 on which the thinner gate oxide layer 106I is grown whereas the gate oxide layer 106II, the thicker gate oxide, is grown on that portion of the semiconductor body 102 which had been shielded from the plasma. The gate oxide layer 106II and part of the gate oxide layer 106II are grown simultaneously to their respective different thicknesses by means of using a well known thermal oxidation process. The respective oxide thicknesses are easily controlled by controlling the time and temperature of the process in an oxidizing ambient.

It is to be noted that the specific embodiment that has been described is illustrative of the general principles of the invention. Various other embodiments can be devised without departing from the spirit and scope of the invention. For example, plasmas of varying compositions may be used.

What is claimed is:

1. In a method for forming two gate oxide layers having different thicknesses on a surface of a CMOS or MOSFET semiconductor body, the improvement of avoiding resist residue on the surface of the gate oxide upon regrowth and avoiding the narrow processing window caused by using low energy implantations for advance designs that use about 0.18 µm design rules, comprising:

a) thermally oxidizing the surface of the semiconductor body to form a silicon oxide layer thereon;

b) providing a patterned photoresist layer over a first portion of the silicon oxide layer to protect same from plasma effects;

c) subjecting a portion of silicon oxide not covered by the patterned photoresist layer to a plasma highly selective to silicon oxide, said plasma comprising HBr, $O_2$, and He, said HBr having a flow rate of 50 sccm, said $O_2$ having a flow rate of 3 sccm, and said He having a flow rate of 100 sccm;

d) removing the patterned photoresist layer and cleaning the surface of said silicon oxide layer with a silicon cleaning solution;

e) subjecting the silicon oxide layer to an etchant to remove portions not covered by the patterned photoresist and partially etching a portion of the first silicon oxide layer protected from the plasma by said removed patterned photoresist layer; and f) thermally oxidizing the semiconductor body to simultaneously form a regrown second silicon oxide layer on the exposed portion of the semiconductor surface to increase the thickness of the portion of the first silicon oxide layer protected by the patterned photoresist layer and form a second silicon oxide layer thinner than the first silicon oxide layer.

2. The method of claim 1 wherein the pressure is 50 mT, the plasma Source Power=300 W, and the Bias Power=80 W.

3. The method of claim 1 wherein the second oxide layer is used as the gate insulator layer of a first field effect transistor and the thickened first oxide layer is used for a second field effect transistor with the first and second field effect transistors being formed on a common semiconductor body.

* * * * *